(12) United States Patent
Katsumi et al.

(10) Patent No.: US 6,335,578 B1
(45) Date of Patent: Jan. 1, 2002

(54) BRUSHLESS DC MOTOR

(75) Inventors: Tetsuya Katsumi, Miyagi-ken; Hideki Takeda; Yoshinori Miura, both of Sendai, all of (JP)

(73) Assignees: YKK Corporation, Toyko; Mitec Corporation, Miyagi-Ken, both of (JP)

( * ) Notice: Subject to any disclaimer, the term of this patent is extended or adjusted under 35 U.S.C. 154(b) by 0 days.

(21) Appl. No.: 09/553,484

(22) Filed: Apr. 20, 2000

(30) Foreign Application Priority Data

Apr. 21, 1999 (JP) .......................................... 11-113190

(51) Int. Cl.$^7$ .......................... H02K 11/00; H01L 43/00
(52) U.S. Cl. ..................................... 310/68 B; 338/32 R
(58) Field of Search .......................... 310/68 B, 156.01, 310/156.05 E, 156.06; 338/32 R; 324/174, 207.21, 252, 260

(56) References Cited

U.S. PATENT DOCUMENTS

| | | | | |
|---|---|---|---|---|
| 4,079,360 A | * | 3/1978 | Ookubo et al. | 365/158 |
| 4,926,122 A | * | 5/1990 | Schroeder et al. | 324/207.13 |
| 4,939,456 A | * | 7/1990 | Morelli et al. | 324/207.21 |
| 5,196,821 A | * | 3/1993 | Partin et al. | 338/32 R |
| 5,422,569 A | * | 6/1995 | Nakahara et al. | 324/174 |
| 5,617,071 A | * | 4/1997 | Daughton | 338/32 R |
| 5,654,600 A | * | 8/1997 | Nomura et al. | 310/68 B |
| 5,708,358 A | * | 1/1998 | Ravipati | 324/252 |
| 5,949,623 A | * | 9/1999 | Lin | 360/113 |
| 6,181,036 B1 | * | 1/2001 | Kazama et al. | 310/68 B |
| 6,183,889 B1 | * | 2/2001 | Koshiba et al. | 428/692 |
| 6,206,181 B1 | * | 3/2001 | Syverson | 198/788 |
| 6,222,290 B1 | * | 4/2001 | Schob et al. | 310/68 B |

FOREIGN PATENT DOCUMENTS

| | | |
|---|---|---|
| JP | 5-207721 | 8/1993 |
| JP | 6-245464 | 9/1994 |

OTHER PUBLICATIONS

N. Kataoka et al., "Giant Magnetoresistance in Film Liquid–quenched Ribbon and Bulk Nanogranular Alloys," Materia, vol. 33, No. 2, Feb. 20, 1994, pp. 165–174.
Hideki Takedo et al., "Colossal Magnetoresistance Effect in Pervskite–type ReMnO$_3$". Materia, vol. 35, No. 11, 1996, pp. 1212–1216.
A.E. Berkowitz, et al., "Giant Magnetoresistance in Heterogeneous Cu–Co Alloys," Physical Review Letters, vol. 68, No. 25, Jun. 22, 1992, pp. 3745–3752.
M.N. Baibich, et al., "Giant Magnetoresistance of (001) Fe/(001) Cr Magnetic Superlattices," Physical Review Letters, vol. 61, No. 21, Nov. 21, 1988, pp. 2472–2475.
S.S.P. Parkin, "Giant Magnetoresistance in antiferromagnetic Co/Cu multilayers," Appl. Phys. Lett. 58 (23), Jun. 10, 1991, pp. 2710–2712.
Landolt–Börnstein New Series 3.3.4, pp. 230–231 (1970).

* cited by examiner

*Primary Examiner*—Nestor Ramirez
*Assistant Examiner*—Dang Dinh Le
(74) *Attorney, Agent, or Firm*—Finnegan, Henderson, Farabow, Garrett & Dunner, L.L.P.

(57) ABSTRACT

In a brushless DC motor comprising a stator provided with a plurality of coils, a rotor magnet magnetized so as to possess a plurality of magnetic poles and rotatably disposed as opposed to the coils of the stator, and a magnetic sensor which detects the magnetic poles of the rotor magnet, in which the electric current supplied to said coils of respective phases is controlled based on a detection signal from said magnetic sensor so that the rotor magnet is rotationally driven, the magnetic sensor comprises in combination a giant magnetoresistive element disposed as opposed to the rotor magnet and a magnet disposed on a rear side of the giant magnetoresistive element. The giant magnetoresistive element is formed of a magnetic particle dispersion type giant magnetoresistive material, an artificial lattice type giant magnetoresistive material, or a colossal magnetoresistive material.

17 Claims, 3 Drawing Sheets

BRUSHLESS DC MOTOR

BACKGROUND OF THE INVENTION

1. Field of the Invention

This invention relates to a brushless DC motor using a giant magnetoresistive element as a magnetoelectric converting element which detects magnetic poles of a magnetic rotor.

2. Description of the Prior Art

In recent years, brushless DC motors are widely used as a capstan motor for forwarding a tape in a videotape recorder (VTR) or an audiotape recorder, a spindle motor for driving a floppy disk or a compact disk, and the like. Likewise in the field of such applications as factory automation (FA) and robot, brushless DC motors which are smaller in size and larger in torque are used.

A conventional brushless DC motor, as illustrated in FIG. 1, is composed of a magnetic rotor (hereinafter referred to as "rotor magnet") 10 formed of a permanent magnet and accommodated rotatably in a housing, exciting oils 11 disposed around the rotor magnet 10 as opposed thereto across a prescribed gap, and rotational angle detecting magnetic sensors 12 interposed between the exciting coils 11. The rotor magnet 10 is rotationally driven by orderly exciting the exciting coils 11 externally depending on the position of magnetic poles of the rotor magnet and the speed of rotation can be controlled with the signal of excitation. Heretofore, a Hall sensor has been employed as the magnetic sensors for discriminating N-S poles of the rotor magnet 10.

An example of the conventional brushless DC motor is shown in FIG. 2.

In FIG. 2, a cylindrical frame 13 is provided at its lower end with a flange part 14 formed integrally therewith, on which a stator core 15 is set in place through the medium of a spacer 16. A circuit substrate 17 including a driving circuit, etc. is also placed on the flange part 14 and fixedly secured thereto together with the stator core 15 and the spacer 16 with screws 18. The stator core 15 is provided at its outer periphery side with a plurality of projected poles on which the exciting coils 11 of each phase are wound respectively. A rotor magnet 10a is disposed around the stator core 15 in such a manner that the inner peripheral surface of the rotor magnet is opposed to the outer peripheral surface of the stator core across a suitable gap. The rotor magnet 10a is fixedly secured to the inner peripheral surface of a rotor casing 19 having generally dish-like contours and magnetized so as to possess a plurality of magnetic poles. The center portion of the rotor casing 19 is fixedly secured to a boss 21 into which a rotating shaft 20 is fitted. The rotating shaft 20 is rotatably supported by the upper and lower pairs of ball bearings 22 and 22 which are arranged inside the frame 13 mentioned above.

Three Hall elements 12 connected to the circuit substrate 17 are respectively disposed in the proximity of the rotor magnet 10a so as to face to the lower surface thereof (see FIG. 1). The Hall elements 12 detect the magnetic poles of the rotor magnet 10a and the detection output is inputted to the aforementioned driving circuit, which in turn passes the electric current through the exciting coils 11 of respective phases at proper time intervals. Thus, by passing the electric current through the exciting coils 11 according to the position of the magnetic poles of the rotor magnet 10a, the rotor magnet 10a is urged to rotate as well known in the art. To each of three Hall elements 12, four sensor leads, i.e. two current input terminals and two output terminals are connected, these terminals being connected to a motor driving circuit through the medium of exciting coils 11 of the stator core 15.

In the brushless DC motor the rotation of the magnets constituting the rotor is detected and the output signal is used as a rotating signal for controlling the rotation of motor. To this end, the sensor is required to have responsiveness to a magnetic field of several kOe and the ability to discriminate the polarity (N/S). Further, it is required to possess the high frequency characteristics in order to detect the N/S poles of the rotor magnet which rotates at high speed. The Hall element has been heretofore used as a sensor which satisfies these requirements. When the electric current flowing through the exciting coil is increased to obtain high output power, however, the sensitivity of the Hall element using a semiconductor such as InSb which is unstable at an elevated temperature decreases because a temperature of the environment in the motor is elevated. This poses the problem that the Hall element is unserviceable at elevated temperatures and the sensor determines the output of the motor. Moreover, since the Hall element requires four lead wires, two for input and two for output, and three elements are usually used in one motor, it is necessary to use twelve lead wires in total. As a result, the layout of wires is complicated, which gives the largest cause to prevent the miniaturization of the motor.

To overcome the problem mentioned above, the idea of utilizing a magnetoresistive element in place of the Hall element is proposed in published Japanese Patent Application, KOKAI (Early Publication) No. 5-207721 and No. 6-245464, for example.

The term "magnetoresistance (MR) effect" as used herein means a phenomenon that the electric resistance offered by a given material is varied by applying a magnetic field to that material. Generally, a ferromagnetic material is used as an MR element. A CoFe alloy having a rate of change of about 5% and a permalloy having a rate of change of about 2%, in magnetoresistance, are typical examples of the MR element. The rate of change of the magnetoresistance effect (magnetoresistance ratio, MR ratio) is expressed by the following formula (1):

$$\text{Magnetoresistance ratio}(\%)=[R(O)-R(H)]/R(O)\times 100 \qquad (1)$$

wherein $R(O)$ represents the electric resistance in the absence of a magnetic field and $R(H)$ represents the electric resistance in the presence of application of a magnetic field.

The utilization of the magnetoresistance effect is effective in realizing miniaturization of a motor as by reducing the number of necessary sensor leads to two and simplifying the layout of wires, for example. Since the brushless DC motor uses a magnet (having a surface magnetic field of not less than 100 [Oe]) as a rotor thereof and the exciting coil thereof for driving the rotor has a strong magnetic field (some hundreds of Oe), however, the sensor which utilizes a magnetoresistive element formed of a soft magnetic material represented by permalloy has the problem that it cannot detect the rotational angle because its detectable magnetic field (not more than some tens of Oe) is surpassed. Further, the magnetoresistive element made of an alloy can not be used under the environment in which the magnetic fluctuation is large, because the magnetic range to which it can respond is narrow.

SUMMARY OF THE INVENTION

The magnetic sensor for use in the small brushless DC motor described above is required to fulfill the following four requirements. The sensors of the conventional class, however, have the problem that none of them cannot satisfy all these requirements.

(1) The sensor should be capable of being easily miniaturized (miniaturization).
(2) The sensor should not suffer the detecting sensitivity of the magnetic field thereof to vary notably with temperature (temperature characteristics).
(3) The sensor should be capable of detecting a magnetic field of up to several kOe (magnetic field characteristics).
(4) The sensor should be capable of detecting an AC magnetic field of up to several kHz (frequency characteristics).

To satisfy these requirements, the present invention provides a brushless DC motor which comprises a stator provided with a plurality of coils, a rotor magnet magnetized so as to possess a plurality of magnetic poles and rotatably disposed as opposed to the coils of the stator, and a sensor capable of detecting the magnetic poles of the rotor magnet, in which the electric current supplied to the coils of respective phases is controlled based on a detection signal from the magnetic sensor so that the rotor magnet is rotationally driven, and the magnetic sensor comprises in combination a giant magnetoresistive element disposed as opposed to the rotor magnet and a magnet disposed on the rear side of the giant magnetoresistive element.

The giant magnetoresistive element mentioned above is formed of a magnetic particle dispersion type giant magnetoresistive material, an artificial lattice type giant magnetoresistive material, or a colossal magnetoresistive material and is capable of reading an AC magnetic field of at least not less than 5 kHz as a signal.

Preferably, the giant magnetoresistive element mentioned above is a magnetic particle dispersion type giant magnetoresistive element which is formed of a material having ferromagnetic particles, about 1 nm to about 500 nm, preferably 1 to 100 nm in maximum major diameter, dispersed in a nonmagnetic (paramagnetic or diamagnetic) material, preferably in such a manner that respective magnetic particles are dispersed therein as separated from each other without contacting at a distance of about 0.5 nm or more, so that the element has the sensitivity to a magnetic field, even under the higher magnetic field of about 50 [Oe] or more in the motor, and the responsiveness to a change in magnetic field of at least 10 kHz in the motor. It may be otherwise an artificial lattice type giant magnetoresistive element which is formed of a material having a nonmagnetic (paramagnetic or diamagnetic) material and a ferromagnetic material, each having a thickness of about 1 nm to about 10 nm, for example, alternately superposed.

By using as a magnetic sensor for a brushless DC motor the giant magnetoresistive element, particularly the magnetic particle dispersion type giant magnetoresistive element in conjunction with a magnet for the application of a bias magnetic field, the magnetic sensor can acquire the wide sensitivity to an AC magnetic field as well as heat resistance, responsiveness to a high frequency, and the sensitivity to a high magnetic field of at least 1 kOe and can detect a change in magnetic field under the environment of a strong magnetic field, and the miniaturization of sensor can be realized. Further, since these giant magnetoresistive elements retain the magnetoresistance effect even at such high temperatures as 300° C., they can be used effectively in an atmosphere retained at elevated temperatures. Accordingly, since the maximum service temperature can be increased to at least 200° C., the electric current to be passed through the exciting coils can be considerably increased, which results in the increase of the rotational power of the motor. That is to say, it can be expected that the brushless DC motor will be widely used in various applications by virtue of the increase of the service temperature and the rotational power of the motor.

BRIEF DESCRIPTION OF THE DRAWINGS

Other objects, features, and advantages of the invention will become apparent from the following description taken together with the drawings, in which.

DETAILED DESCRIPTION OF THE PREFERRED EMBODIMENTS

Figure 1:
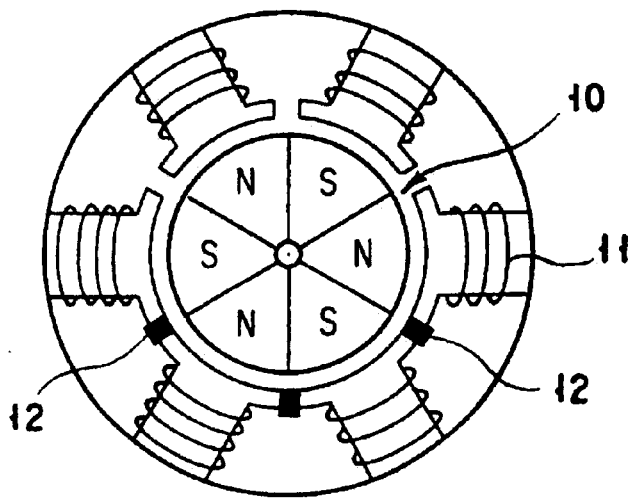
FIG. 1 is a diagram schematically illustrating the concept of a conventional brushless DC motor.
Figure 2:
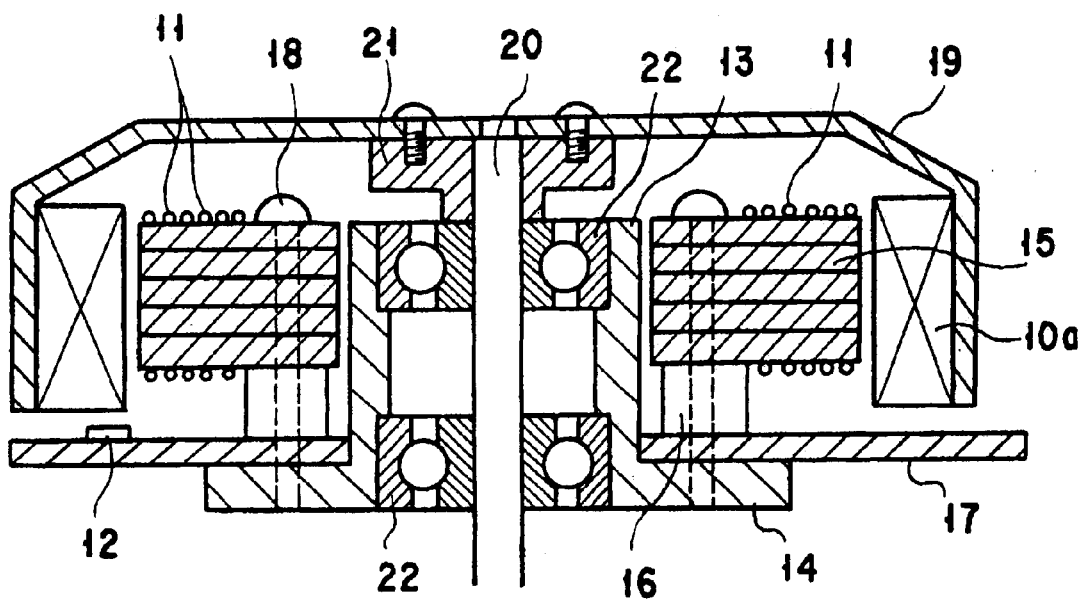
FIG. 2 is a cross-sectional view schematically illustrating the construction of the conventional brushless DC motor.

The present invention is characterized by utilizing as a magnetic sensor for a brushless DC motor a giant magnetoresistive sensor. Specifically, the present invention enables the giant magnetoresistive element to discriminate the polarity of the magnetic poles of a rotor magnet by having the giant magnetoresistive element built in a motor housing as approximated closely to the rotor magnet of high magnetic field (some hundreds of Oe to several kOe) and further by disposing a suitable magnet approximated closely to the sensor.

The term "giant magnetoresistance (GMR) effect" as used herein refers to the magnetic particle dispersion type magnetoresistance effect reported by A. E. Berkowitz et al. in Phys. Rev. Lett. 68 (1992), p. 3745, and by J. Q. Xiao et al. in Phys. Rev. Lett. 68 (1992), p. 3749 or to the artificial lattice type giant magnetoresistance effect reported by M. N. Baibich et al. in Phys. Rev. Lett. 61 (1988), p. 2473 and by S. S. P. Parkin et al. in Appl. Phys. Lett. 58 (1991), p. 2710. It is held that the magnetoresistance effects of these materials, as explained in Kataoka et al. "Materia", Vol. 33, No. 2 (1994), p. 165, are ascribable to the spin-dependent scattering of the electrons which bear the burdens of magnetization and conduction of a magnetic substance (precipitated particles or a multilayer film). Since these materials use Co, Ni, Fe, or alloys thereof as the magnetic substance, they bring no change in magnetization up to at least 300° C. and produce a large magnetoresistance effect.

The material manifesting the colossal magnetoresistance (CMR) effect is, for example, an oxide possessing an Mn-based perovskite structure represented by the formula, $La(AE)MnO_3$, wherein AE represents an alkaline earth metal Ca, Sr, or Ba. The study on this material was started in the era of 1950's [Landolt-Bornstein New Series III/4a (1970) III/12a (1978)]. In recent years, it has come to arrest special interest as a substance exhibiting a change in electric resistance from an insulator grade to a metal grade depending on a magnetic field at low temperature ["Materia", Vo. 35, No. 11 (1996), p. 1217].

The materials of this class are characterized by producing no significant change in sensitivity even under elevated temperatures and a change in magnetoresistance even in a magnetic field of not less than several kOe and, therefore, allowing measurement of a change of magnetic field due to the rotation of a rotor magnet by having a sensor disposed inside a motor. Besides, these materials are characterized by requiring only two lead wires, i.e. just one half of the ordinary quantity required by the Hall element, and consequently simplifying the work of wiring and facilitating miniaturization of the motor. Furthermore, they respond to the change of magnetic field at 300 Oe up to 5 kHz.

That is, the materials satisfy the requirements, "miniaturization", "temperature characteristics", "magnetic field characteristics", and "high frequency characteristics" mentioned above, which are imposed on the magnetic sensor for the small brushless DC motor.

The preferred material for the magnetic particle dispersion type giant magnetoresistive element possesses a composition represented by the general formula: $NM_{1-x}TM_x$, wherein "NM" represents at least one element selected from among Ag, Au, Cu, and Pt, "TM" represents at least one element selected from among Fe, Co, and Ni, and "x" represents an atomic ratio in the range of $0.05 \leq x < 0.4$, preferably $0.1 \leq x < 0.35$.

Another preferred material for the magnetic particle dispersion type giant magnetoresistive element comprises as a main component thereof an alloy having a composition represented by the general formula: $A_{1-y}Co_y$, wherein "A" represents a compound composed of at least one member selected from among MgO and $Al_2O_3$, and "y" represents a volumetric ratio in the range of $0.05 \leq y < 0.35$.

Preferably, the material for the artificial lattice type giant magnetoresistive element is composed of a nonmagnetic material (NM) comprising at least one element selected from among Ag, Cu, and Au and a ferromagnetic material (TM) comprising at least one element selected from among Fe, Co, and Ni.

In the composition of the magnetic particle dispersion type giant magnetoresistive element represented by the general formula mentioned above or the material for the aforementioned artificial lattice type giant magnetoresistive element, the nonmagnetic material (NM) is allowed to incorporate therein up to 20 atomic %, preferably not more than 10 atomic %, of one or more other elements such as Al, Ti, Pd, Pt, and Rh. While these elements deteriorate the magnetoresistance effect and lower the sensitivity, Al and Ti which are capable of reducing the temperature dependency of the magnetoresistance effect and Pd, Pt, and Rh which are capable of increasing the electric resistance are effective in enlarging the magnetoresistance effect of the whole sensor inclusive of the wiring. Similarly, the ferromagnetic material (TM) is allowed to incorporate therein such elements as Cr and Mn in a maximum of 5 atomic % in addition to Fe, Co, and Ni. Particularly, while Cr and Mn decrease the magnetoresistance effect, they are capable of preventing the magnetic particles from being coarsened and enhancing the heat resistance.

Preferably, the aforementioned colossal magnetoresistive element uses as a main component thereof a material possessing a composition represented by the general formula: $Ln_{1-z}AE_zMnO_{3-p}$, wherein "Ln" represents at least one element selected from among the rare earth elements, "AE" represents at least one element selected from among Ca, Sr, and Ba, and "z" and "p" respectively represent atomic ratios falling in the ranges of $0.2 \leq z \leq 0.4$ and $-0.1 \leq p \leq 0.3$, providing that not less than 95 atomic % of the material possesses the aforementioned composition).

Particularly preferably, the material has strontium as the AE element mentioned above. It is also preferable to use La mainly as the rare earth element.

In the three species of materials mentioned above, it is proper to adopt the magnetic particle dispersion type giant magnetoresistive material and the artificial lattice type giant magnetoresistive material for the purpose of use in the brushless DC motor. This is because the colossal magnetoresistive material necessitates a heat treatment at elevated temperatures (700–900° C.) for enhancing the temperature characteristics thereof and consequently renders difficult the process of manufacture thereof and further because it has such high electric resistance as several kΩ and consequently allows no easy flow of electric current.

Now, the magnetic sensor for use in the brushless DC motor according to the present invention will be described below by reference to the drawings attached hereto.

Figure 3:
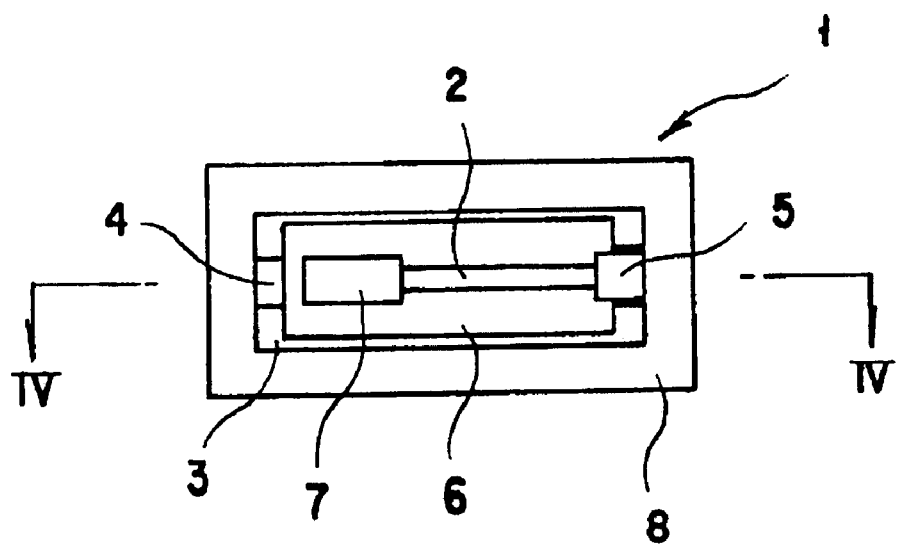
FIG. 3 is a plan view schematically illustrating a magnetic sensor to be used in the brushless DC motor of the present invention.
Figure 4:
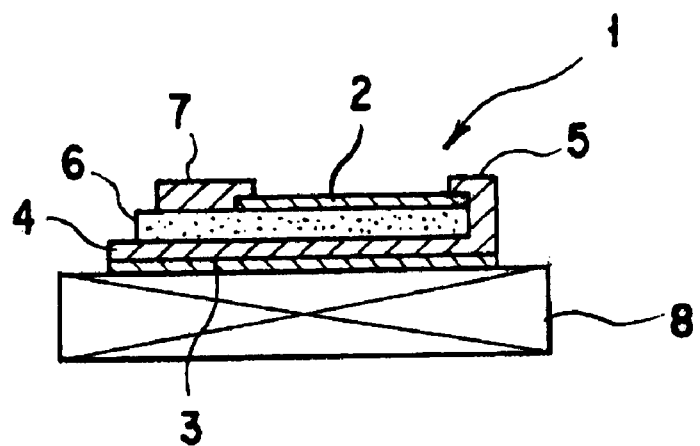
FIG. 4 is a cross section taken through FIG. 3 along the line IV—IV.

FIG. 3 is a plan view of a detecting part of the magnetic sensor 1 of the present invention and FIG. 4 is a cross section taken through FIG. 3 along the line IV—IV.

In FIG. 3 and FIG. 4, the reference numeral 2 represents a thin film giant magnetoresistive element (sensor element) which is formed of such a giant magnetoresistive material as mentioned above. An elongated first sensor lead 4 made of copper is formed on a substrate 3 and a projecting part 5 similarly made of copper is integrally raised from the leading end of the first sensor lead 4. An insulating layer 6 made of $Al_2O_3$ is superposed on the first sensor lead 4 in such a manner as to cover it. On the insulating layer 6 the giant magnetoresistive element 2 mentioned above is formed and an elongated second sensor lead 7 made of copper is formed in such a manner as to cover one end of the giant magnetoresistive element 2. The leading end of the giant magnetoresistive elements 2 is fixed by the folded part at the upper terminal of the projecting part 5 of the first sensor lead 4. Further, a permanent magnet 8 is attached to the rear side of the substrate 3. This is because the discrimination of the N/S poles of a rotor magnet is required to determine the direction of rotation of the rotor magnet in the motor of high magnetic field and, therefore, the bias magnetic field stronger than that of the magnet used in the motor should be applied to the sensor. When the sensor is provided with a magnet for the bias magnetic field, it can carry out the function of the Hall element as a substitution therefor. As the magnet to be used herein, an electromagnet and a permanent magnet may be used, particularly a strong magnet such as a samarium-cobalt magnet and a neodymium-iron-boron magnet can be advantageously used.

Properly, the giant magnetoresistive element 2 is in the form of thin film measuring not less than about 10 nm and not more than about 1 μm in film thickness, not more than about 5 mm in length, and not more than about 0.5 mm in width.

The sensor lead mentioned above may be manufactured from such electroconductive materials as Al, Cu, Cr, Ta, or Mo or alloys thereof, particularly preferably Cu among other materials mentioned above. As the material for the insulating layer mentioned above, $Al_2O_3$, $SiO_2$, MgO, and other similar metal oxides may be used.

When the giant magnetoresistive sensor mentioned above is actually used as the magnetic sensor for the brushless DC motor, the induced electromotive force from the lead wires due to an abrupt change in magnetic field should be avoided. For this purpose, a structure capable of exclusively detecting the magnetic field of the sensor part can be formed by superposing wires in such a manner as to reduce in size the loops in the wires which can be the cause therefor. Thus, a laminated structure having an insulating layer 6 such as of $Al_2O_3$ or MgO interposed between two electrodes (sensor leads 4, 5 and 7) which are connected to the opposite terminals of the giant magnetoresistive element 2 is adopted. Properly, the insulating layer has a thickness of not less than about 0.5 nm and not more than about 1,000 nm, preferably not less than 10 nm and not more than 100 nm.

Figure 5:
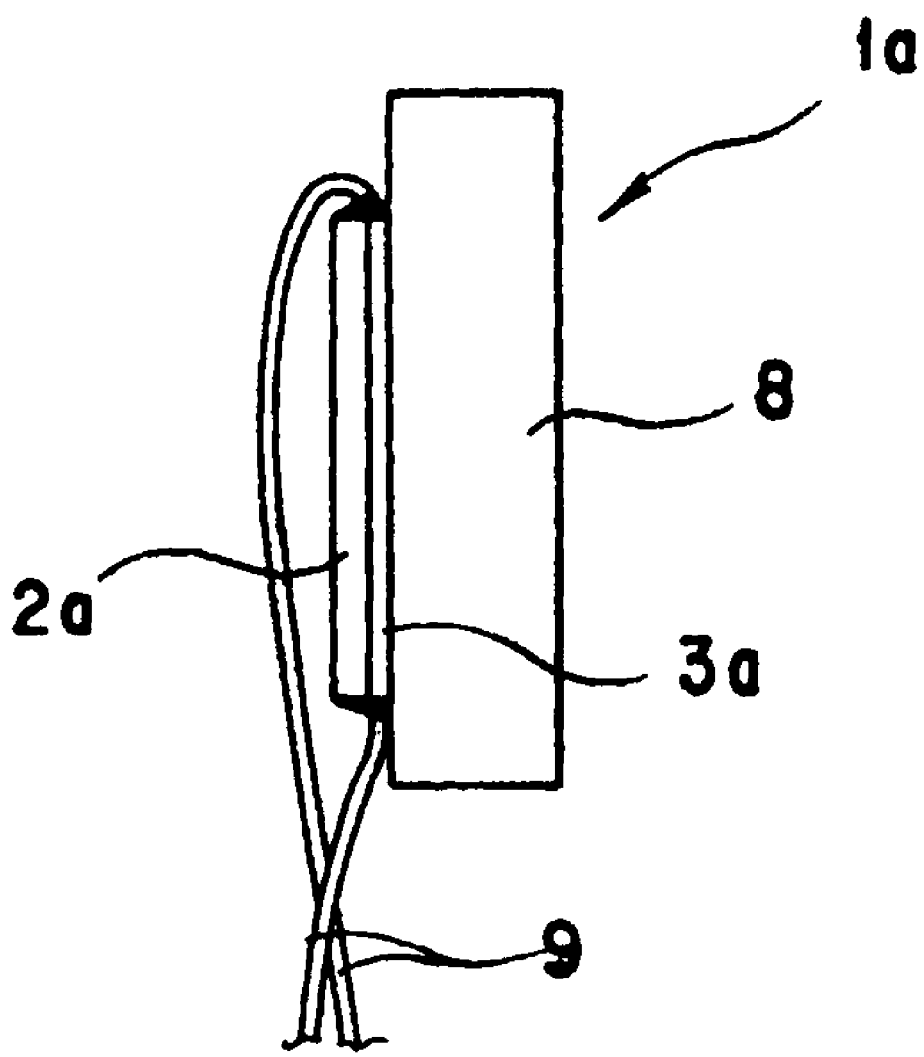
FIG. 5 is a side view schematically illustrating another embodiment of the magnetic sensor to be used in the brushless DC motor of the present invention.

FIG. 5 illustrates another embodiment of the magnetic sensor for use in the brushless DC motor according to the present invention.

In the magnetic sensor shown in FIG. 5, the reference numeral 2a denotes a wire-like giant magnetoresistive element (sensor element) which is formed of such a giant magnetoresistive material as mentioned above. The sensor element 2a is fixedly secured to a permanent magnet 8 for application of the bias magnetic field through the medium of a plate-like spacer member 3a made of a suitable material such as glass and aluminum. The reference numeral 9 denotes lead wires respectively connected to the opposite terminals of the sensor element 2a.

The sensor elements 2, 2a mentioned above can be manufactured by various suitable methods, such as a liquid quenching method like a liquid spinning process or a melt spinning process, and a sputtering method. In view of the productivity and the production cost, it is preferred to produce a sensor element in the form of a slender wire or a rectangular thin film measuring not more than 50 μm in diameter or thickness by the liquid quenching method such as the liquid spinning process or melt spinning process.

For the purpose of enabling the sensor to have the sensitivity to the magnetic field, even if the temperature of the atmosphere inside the motor is 200° C., without no variation with time, it is desirable that the sensor should be subjected to a heat treatment at a temperature of not less than 200° C. after the production thereof or produced at a temperature of not less than 200° C. For instance, the sensor may be produced by subjecting the material mentioned above to a solution treatment, preparing a supersaturated solid solution by the water quenching of the resultant melt, and then subjecting the resultant solid solution to a heat treatment.

Now, working examples which had specifically demonstrated the effects of the present invention will be shown below.

The magnetic sensor was manufactured by the sputtering process as follows.

As the magnetic particle dispersion type giant magnetoresistive material, a composite target prepared by evenly distributing Co chips or $Ni_{0.66}Co_{0.18}Fe_{0.16}$ alloy chips on an Ag target or a Cu target was used.

The film-forming conditions and the heat-treating conditions were as follows:

Film-forming method: RF magnetron sputtering
Substrate: Si wafer
Substrate temperature: 100° C.
Atmosphere: Ar 0.6 Pa
Sputtering power: 100 W
Thin film composition: $Ag_{70}Co_{30}$ and $Ag_{75}(Ni_{0.66}Co_{0.18}Fe_{0.16})_{25}$
Film thickness: 10 nm
Heat treatment:
Temperature: 200° C.
Duration: 0.5 hour
Atmosphere: Vacuum
Magnetoresistance effect: Magnetoresistance ratio of about 10% in a magnetic field of 10 kOe (the value found by the formula (1) mentioned hereinbefore)

A Cu/Co thin film exhibiting the artificial lattice type giant magnetoresistance effect was manufactured by alternately superposing the thin films of Cu and Co targets on a substrate by the RF sputtering process. The film-forming conditions were as shown below:

Film-forming method: RF sputtering
Substrate: Si wafer
Substrate temperature: 100° C.
Atmosphere: Ar 0.6 Pa
Sputtering power: 100 W (Co) and 100 W (Cu)
Number of layers superposed: 20 (20 alternately superposed layers each of Cu and Co)
Layer thickness: Co (1.0 nm each) and Cu (1.0 nm each)
Heat treatment: None
Magnetoresistance effect: Magnetoresistance ratio of about 15% in a magnetic field of 10 kOe (the value found by the formula (1) mentioned hereinbefore)

Further, a thin film of $La_{0.67}Sr_{0.33}MnO_3$ exhibiting the colossal magnetoresistance effect was manufactured by the RF sputtering process. The target used herein was manufactured by sintering a compound, $La_{0.67}Sr_{0.33}MnO_3$, by the solid-phase reaction process.

Film-forming method: RF sputtering
Substrate: Si wafer
Substrate temperature: 500° C.
Atmosphere: Ar 2.4 Pa+$O_2$ 0.6 Pa
Sputtering power: 100 W
Film thickness: 0.5 μm
Heat treatment:
Temperature: 500–900° C.
Duration: 0.5 hour
Atmosphere: Air
Magnetoresistance effect: Magnetoresistance ratio of about 5% in a magnetic field of 10 kOe (the value found by the formula (1) mentioned hereinbefore)

Each of the thin films mentioned above were formed into a rectangular shape having a length of 0.5 mm and a width of 0.1 mm. The thickness thereof was adjusted to 0.01 to 0.5 μm thereby changing the resistance of the sensor in the range of from 2 to 50 Ω. As a permanent magnet, $SmCo_5$ ferrite magnets were used so as to change the bias magnetic field in the range of from 100 [Oe] to 2.5 [kOe]. Each of the above giant magnetoresistive elements in the form of rectangular thin film was fixedly secured to the permanent magnet mentioned above through the medium of a plate-like spacer member (0.2 to 1 mm in thickness) made of glass or aluminum. Three magnetic sensors obtained were respectively disposed on the gaps of a stator of a brushless DC motor. When the change of N/S poles of the permanent magnet in the rotor magnet was read, there could be obtained a signal similar to that obtained by using Hall sensors. Further, when the electric current supplied to the coils of the stator was increased, the temperature of the environment in the motor was elevated to about 150° C. Even in this condition, it was confirmed that the rotational position of the rotor magnet can be detected sufficiently and the torque increased by 20% or more, though the signal decreased to a level lower than that at room temperature by 30%.

Incidentally, it is necessary to use at least two magnetic sensors in order to detect the direction of rotation of the rotor magnet.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

The disclosure in Japanese Patent Application No. 11-113190 of Apr. 21, 1999 is incorporated here by reference. This Japanese Patent Application describes the invention described hereinabove and claimed in the claims appended hereinbelow and provides the basis for a claim of priority for the instant invention under 35 U.S.C. 119.

What is claimed is:

1. A brushless DC motor comprising a stator provided with a plurality of coils, a rotor magnet magnetized so as to possess a plurality of magnetic poles and rotatably disposed as opposed to the coils of said stator, and a magnetic sensor capable of detecting the magnetic poles of said rotor magnet, in which the electric current supplied to said coils of respective phases is controlled based on a detection signal from said magnetic sensor so that said rotor magnet is rotationally driven, wherein said magnetic sensor comprises in combination a giant magnetoresistive element disposed as opposed to said rotor magnet and a magnet disposed on a rear side of said giant magnetoresistive element, said giant magnetoresistive element being a magnetic particle dispersion giant magnetoresistive element which contains as a main component an alloy having a composition represented by either one of the following general formulas:

$$NM_{1-x}TM_x$$

wherein NM represents at least one element selected from the group consisting of Ag, Au, Cu, and Pt, TM represents at least one element selected from the group consisting of Fe, Co, and Ni and x represents an atomic ratio in the range of $0.05 \leq x < 0.4$, and $$A_{1-y}Co_y$$

wherein A represents a compound composed of at least one member selected from the group consisting of MgO and $Al_2O_3$, and y represents a volumetric ratio in the range of $0.05 \leq y < 0.35$.

2. The brushless DC motor according to claim 1, wherein said giant magnetoresistive element is a magnetic particle dispersion giant magnetoresistive element in which ferromagnetic particles containing said TM element as a main component thereof are dispersed in a nonmagnetic metal containing said NM element as a main component thereof in such a manner that respective ferromagnetic particles are dispersed in said nonmagnetic metal as separated from each other without contacting at a distance of about 0.5 nm or more.

3. The brushless DC motor according to claim 2, wherein said ferromagnetic particles have a size of about 1 nm to about 100 nm in major diameter.

4. The brushless DC motor according to claim 1, wherein said giant magnetoresistive element is a magnetic particle dispersion giant magnetoresistive element in which ferromagnetic particles containing cobalt as a main component thereof are dispersed in a nonmagnetic compound containing said A compound as a main component thereof in such a manner that respective ferromagnetic particles are dispersed in said nonmagnetic compound as separated from each other without contacting at a distance of about 0.5 nm or more.

5. The brushless DC motor according to claim 4, wherein said ferromagnetic particles have a size of about 1 nm to about 100 nm in major diameter.

6. The brushless DC motor according to claim 1, wherein said giant magnetoresistive element is a magnetic particle dispersion giant magnetoresistive element subjected to a heat treatment at a temperature of not less than 200° C. after the production thereof.

7. The brushless DC motor according to claim 1, wherein said giant magnetoresistive element is a magnetic particle dispersion giant magnetoresistive element produced at a temperature of not less than 200° C.

8. The brushless DC motor according to claim 1, wherein said giant magnetoresistive element is a magnetic particle dispersion giant magnetoresistive element in the form of a thin film having a thickness of not less than 10 nm and not more than about 1 µm.

9. The brushless DC motor according to claim 1, wherein said giant magnetoresistive element is a magnetic particle dispersion giant magnetoresistive element in the form of a slender wire or a rectangular thin film measuring not more than 50 µm in diameter or thickness produced by a liquid quenching method.

10. The brushless DC motor according to claim 1, wherein said NM in the composition contains at least one element selected from the group consisting of Al, Ti, Pd, Pt, and Rh in an amount of up to a maximum of 20 atomic % and said TM in the composition contains at least one element selected from the group consisting of Cr and Mn in an amount of up to a maximum of 5 atomic %.

11. The brushless DC motor according to claim 1, wherein said giant magnetoresistive element is an artificial lattice giant magnetoresistive element which is formed of a material having a nonmagnetic material and a ferromagnetic material alternately superposed.

12. The brushless DC motor according to claim 11, wherein said nonmagnetic material is at least one element selected from the group consisting of Ag, Cu, and Au and said ferromagnetic material is at least one element selected from the group consisting of Fe, Co, and Ni.

13. The brushless DC motor according to claim 11, wherein said nonmagnetic material contains at least one element selected from the group consisting of Al, Ti, Pd, Pt, and Rh in an amount of up to a maximum of 20 atomic % and said ferromagnetic material contains at least one element selected from the group consisting of Cr and Mn in an amount of up to a maximum of 5 atomic %.

14. The brushless DC motor according to claim 1, wherein said permanent magnet is an electromagnet or permanent magnet capable of applying to said magnetic sensor a bias magnetic field stronger than that of the magnet used in the motor.

15. The brushless DC motor according to claim 1, wherein said magnetic sensor comprises a substrate, an elongated first sensor lead formed on said substrate, an insulating layer superposed in a covering manner on said first sensor lead, an elongated second sensor lead formed on said insulating layer, a giant magnetoresistive element disposed on said insulating layer in such a manner as to connect terminal parts of said first sensor lead and second sensor lead, and a magnet fixedly secured to a rear side of said substrate.

16. The brushless DC motor according to claim 15, wherein said giant magnetoresistive element is a rectangular thin film measuring not more than 5 mm in length and not more than 0.5 mm in width.

17. The brushless DC motor according to claim 15, wherein said insulating layer is formed of $Al_2O_3$, $SiO_2$, or MgO and has a thickness in the range of 0.5 to 1,000 nm.

* * * * *